US009053272B2

(12) United States Patent
Panofsky et al.

(10) Patent No.: US 9,053,272 B2
(45) Date of Patent: Jun. 9, 2015

(54) METHOD AND APPARATUS OF HARDWARE ACCELERATION OF EDA TOOLS FOR A PROGRAMMABLE LOGIC DEVICE

(75) Inventors: Edward F. Panofsky, Woodside, CA (US); Richard A. Karp, Palo Alto, CA (US)

(73) Assignee: TicTran Corp., Mountain View, CA (US)

( * ) Notice: Subject to any disclaimer, the term of this patent is extended or adjusted under 35 U.S.C. 154(b) by 0 days.

(21) Appl. No.: 13/420,002

(22) Filed: Mar. 14, 2012

(65) Prior Publication Data

US 2013/0019213 A1    Jan. 17, 2013

Related U.S. Application Data

(60) Provisional application No. 61/508,416, filed on Jul. 15, 2011.

(51) Int. Cl.
*G06F 17/50* (2006.01)

(52) U.S. Cl.
CPC ................ *G06F 17/5054* (2013.01)

(58) Field of Classification Search
USPC .................. 716/100, 110, 116, 117
See application file for complete search history.

(56) References Cited

U.S. PATENT DOCUMENTS

| | | | | |
|---|---|---|---|---|
| 5,510,730 A * | 4/1996 | El Gamal et al. | ............... | 326/41 |
| 6,941,538 B2 * | 9/2005 | Hwang et al. | ................ | 716/102 |
| 7,224,182 B1 * | 5/2007 | Hutchings et al. | ............. | 326/38 |
| 8,479,069 B2 * | 7/2013 | Miller et al. | ................. | 714/734 |
| 2003/0067321 A1 * | 4/2003 | Turner | ........................... | 326/39 |
| 2003/0149962 A1 * | 8/2003 | Willis et al. | ................... | 717/135 |
| 2005/0278680 A1 * | 12/2005 | Mukherjee et al. | ............. | 716/16 |
| 2006/0241921 A1 * | 10/2006 | Willis | ............................. | 703/2 |
| 2010/0023308 A1 * | 1/2010 | Willis et al. | ..................... | 703/13 |

* cited by examiner

*Primary Examiner* — Sun Lin
(74) *Attorney, Agent, or Firm* — Kenta Suzue; Haynes Beffel & Wolfeld LLP

(57) ABSTRACT

Disclosed is a hardware accelerator for development engineering processes for a programmable logic device, such as for an FPGA.

35 Claims, 8 Drawing Sheets

| File | Design# | Software Time(sec) | FPGA time(sec) | blocks | nets | clbs | inputs | outputs | connections | Array Size |
|---|---|---|---|---|---|---|---|---|---|---|
| test | 1 | 14 | 13 | 253 | 767 | 243 | 4 | 6 | 3237 | 16 X 16 |
| testa | 2 | 39 | 35 | 505 | 1533 | 486 | 7 | 12 | 6474 | 23 X 23 |
| testb | 3 | 73 | 65 | 757 | 2299 | 729 | 10 | 18 | 9711 | 27 X 27 |
| testc | 4 | 112 | 93 | 1009 | 3065 | 972 | 13 | 24 | 12948 | 32 X 32 |
| testd | 5 | 151 | 128 | 1261 | 3831 | 1215 | 16 | 30 | 16185 | 35 X 35 |
| teste | 6 | 195 | 165 | 1513 | 4597 | 1458 | 19 | 36 | 19422 | 39 X 39 |
| testf | 7 | 245 | 201 | 1765 | 5363 | 1701 | 22 | 42 | 22659 | 42 X 42 |
| testg | 8 | 305 | 249 | 2017 | 6129 | 1944 | 25 | 48 | 25896 | 45 X 45 |
| testh | 9 | 356 | 286 | 2269 | 6895 | 2187 | 28 | 54 | 29133 | 47 X 45 |
| testi | 10 | 408 | 323 | 2521 | 7661 | 2430 | 31 | 60 | 32370 | 50 X 45 |
| testj | 11 | 490 | 381 | 2773 | 8427 | 2673 | 34 | 66 | 35607 | 52 X 52 |
| testk | 12 | 531 | 413 | 3025 | 9193 | 2916 | 37 | 72 | 38844 | 54 X 54 |
| testl | 13 | 620 | 471 | 3277 | 9959 | 3159 | 40 | 78 | 42081 | 57 X 57 |
| testm | 14 | 719 | 525 | 3529 | 10725 | 3402 | 43 | 84 | 45318 | 59 X 59 |
| testn | 15 | 766 | 560 | 3781 | 11491 | 3645 | 46 | 90 | 48555 | 61 X 61 |
| testo | 16 | 870 | 636 | 4403 | 12257 | 3888 | 49 | 96 | 51792 | 63 X 63 |
| testp | 17 | 938 | 685 | 4282 | 12823 | 4285 | 52 | 102 | 55029 | 65 X 65 |
| testq | 18 | 1053 | 733 | 4537 | 13789 | 4374 | 55 | 108 | 58266 | 67 X 67 |
| testr | 19 | 1124 | 764 | 4789 | 14555 | 4617 | 58 | 114 | 61503 | 68 X 68 |
| tests | 20 | 1252 | 829 | 5041 | 15321 | 4860 | 61 | 120 | 64740 | 70 X 70 |
| testt | 21 | 1338 | 894 | 5293 | 16087 | 5103 | 64 | 126 | 67977 | 72 X 72 |
| testu | 22 | 1511 | 980 | 5545 | 16853 | 5346 | 67 | 132 | 71214 | 74 X 74 |
| testv | 23 | 1609 | 1011 | 5797 | 17619 | 5589 | 70 | 138 | 74451 | 75 X 75 |
| testw | 24 | 1767 | 1069 | 6049 | 18385 | 5832 | 73 | 144 | 77688 | 77 X 77 |
| testx | 25 | 1852 | 1163 | 6301 | 19151 | 6075 | 76 | 150 | 80925 | 78 X 78 |
| testy | 26 | 1958 | 1223 | 6553 | 19917 | 6318 | 79 | 156 | 84162 | 80 X 80 |

Fig. 8

METHOD AND APPARATUS OF HARDWARE ACCELERATION OF EDA TOOLS FOR A PROGRAMMABLE LOGIC DEVICE

REFERENCE TO RELATED APPLICATION

This application claims the benefit of U.S. Provisional Application No. 61/508,416, filed 15 Jul. 2011. This application is incorporated herein by reference.

BACKGROUND OF THE INVENTION

Field of the Invention

Disclosed is a hardware accelerator for development engineering processes for a programmable logic device, such as for an FPGA. Programmable logic device designs are typically developed by writing code in a text editor using a high level language such as Verilog or VHDL and, combined with other intellectual property, "compiled" into a binary file which can be loaded into the programmable logic device chip for operation. This "compilation" consists of a number of steps and can be quite time consuming, with even a very high speed workstation taking many hours for a large design. This can be a big productivity hit reducing the effectiveness of engineers.

SUMMARY

Various embodiments are disclosed for technology that relates to a hardware accelerator for development engineering processes for a programmable logic device, such as for an FPGA. In the present application, a "programmably" configurable interconnection on a programmable logic device, is an interconnection that is configurable by programming the programmable logic device.

One aspect of the technology is an apparatus that divides roles between a general purpose microprocessor and a first programmable logic device, in making a configuration definition which is loaded into a second programmable logic device to implement a circuit design on the second programmable logic device. The apparatus includes a general purpose microprocessor and the first programmable logic device.

The general purpose microprocessor is configured to perform general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition.

The first programmable logic device has programmably configurable interconnections. The first programmable logic device is coupled to the general purpose microprocessor by a local bus. The first programmable logic device with programmably configurable interconnections is configured to perform the particular steps in making the configuration definition more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device and the second programmable logic device are field programmable gate arrays.

In one embodiment, at least one of the first programmable logic device and the second programmable logic device is a field programmable gate array.

Another aspect of the technology is a method of a general purpose microprocessor and a first programmable logic device performing roles in making a configuration definition which is loaded into a second programmable logic device to implement a circuit design on the second programmable logic device. The method includes the step(s) of:

The general purpose microprocessor performing general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and The first programmable logic device with programmably configurable interconnections performing the particular steps in making the configuration definition more quickly than the general purpose microprocessor, the first programmable logic device with programmably configurable interconnections configured to perform the particular steps in making the configuration definition more quickly than the general purpose microprocessor, the first programmable logic device coupled to the general purpose microprocessor by a local bus.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device and the second programmable logic device are field programmable gate arrays.

In one embodiment, at least one of the first programmable logic device and the second programmable logic device is a field programmable gate array.

Another aspect of the technology is an apparatus with a first programmable logic device having a role in making a configuration definition which is loaded into a second programmable logic device to implement a circuit design on the second programmable logic device. The apparatus includes the first programmable logic device.

The first programmable logic device has programmably configurable interconnections. The first programmable logic device is configured to perform particular steps in making the configuration definition which is loaded into the second programmable logic device with programmably configurable interconnections to implement the circuit design on the second programmable logic device with programmably configurable interconnections. The first programmable logic device is reliant on a general purpose microprocessor coupled by a local bus to the first programmable logic device to execute general steps in making the configuration definition. The first programmable logic device is configured to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device and the second programmable logic device are field programmable gate arrays.

In one embodiment, at least one of the first programmable logic device and the second programmable logic device is a field programmable gate array.

Another aspect of the technology is a method of a first programmable logic device performing a role in making a configuration definition which is loaded into a second programmable logic device to implement a circuit design on the second programmable logic device. The method includes the step(s) of:

The first programmable logic device with programmably configurable interconnections performing particular steps in making the configuration definition which is loaded into the second programmable logic device with programmably configurable interconnections to implement the circuit design on the second programmable logic device with programmably configurable interconnections, the first programmable logic device being reliant on a general purpose microprocessor coupled by a local bus to the first programmable logic device to execute general steps in making the configuration definition, the first programmable logic device configured to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device and the second programmable logic device are field programmable gate arrays.

In one embodiment, at least one of the first programmable logic device and the second programmable logic device is a field programmable gate array.

Another aspect of the technology is a non-transitory computer readable medium encoded with instructions programming a first programmable logic device having a role in making a configuration definition which is loaded into a second programmable logic device to implement a circuit design on the second programmable logic device. The instructions include:

Computer readable instructions configuring the first programmable logic device with programmably configurable interconnections to perform particular steps in making the configuration definition which is loaded into the second programmable logic device with programmably configurable interconnections to implement the circuit design on the second programmable logic device with programmably configurable interconnections, the instructions configuring the first programmable logic device to be reliant on a general purpose microprocessor coupled by a local bus to the first programmable logic device to execute general steps in making the configuration definition, the instructions configuring the first programmable logic device to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device and the second programmable logic device are field programmable gate arrays.

In one embodiment, at least one of the first programmable logic device and the second programmable logic device is a field programmable gate array.

Another aspect of the technology is an apparatus that divides roles between a general purpose microprocessor and a first programmable logic device, in making a configuration definition which is loaded into a second programmable logic device to implement a circuit design on the second programmable logic device. The apparatus includes the general purpose microprocessor and the first programmable logic device.

The general purpose microprocessor is configured to perform general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and The first programmable logic device is coupled to the general purpose microprocessor by a local bus. The first programmable logic device is configured to perform the particular steps in making the configuration definition more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device is one of a digital signal processing chip, a graphics processing unit chip, a gate array chip, and an application-specific integrated circuit; and the second programmable logic device is a field programmable gate array.

Another aspect of the technology is a method of a general purpose microprocessor and a first programmable logic device performing roles in making a configuration definition which is loaded into a second programmable logic device to implement a circuit design on the second programmable logic device. The method includes the step(s) of:

The general purpose microprocessor performing general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and The first programmable logic device performing the particular steps in making the configuration definition more quickly than the general purpose microprocessor, the first programmable logic device configured to perform the particular steps in making the configuration definition more quickly than the general purpose microprocessor, the first programmable logic device coupled to the general purpose microprocessor by a local bus.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device is one of a digital signal processing chip, a graphics processing unit chip, a gate array chip, and an application-specific integrated circuit; and the second programmable logic device is a field programmable gate array.

Another aspect of the technology is an apparatus with a first programmable logic device having a role in making a configuration definition which is loaded into a second programmable logic device to implement a circuit design on the second programmable logic device. The apparatus includes the first programmable logic device.

The first programmable logic device is configured to perform particular steps in making the configuration definition which is loaded into the second programmable logic device with programmably configurable interconnections to implement the circuit design on the second programmable logic device with programmably configurable interconnections. The first programmable logic device is reliant on a general purpose microprocessor coupled by a local bus to the first programmable logic device to execute general steps in making the configuration definition. The first programmable logic device is configured to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device is one of a digital signal processing chip, a graphics processing unit chip, a gate array chip, and an application-specific integrated circuit; and the second programmable logic device is a field programmable gate array.

Another aspect of the technology is a method of a first programmable logic device performing a role in making a configuration definition which is loaded into a second programmable logic device to implement a circuit design on the second programmable logic device. The method includes the step(s) of:

The first programmable logic device performing particular steps in making the configuration definition which is loaded into the second programmable logic device with programmably configurable interconnections to implement the circuit design on the second programmable logic device with programmably configurable interconnections, the first programmable logic device being reliant on a general purpose microprocessor coupled by a local bus to the first programmable logic device to execute general steps in making the configuration definition, the first programmable logic device configured to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device is one of a digital signal processing chip, a graphics processing unit chip, a gate array chip, and an application-specific integrated circuit; and the second programmable logic device is a field programmable gate array.

Another aspect of the technology is a non-transitory computer readable medium encoded with instructions programming a first programmable logic device having a role in making a configuration definition which is loaded into a second programmable logic device to implement a circuit design on the second programmable logic device. The instructions include:

Computer readable instructions configuring the first programmable logic device to perform particular steps in making the configuration definition which is loaded into the second programmable logic device with programmably configurable interconnections to implement the circuit design on the second programmable logic device with programmably configurable interconnections, the instructions configuring the first programmable logic device to be reliant on a general purpose microprocessor coupled by a local bus to the first programmable logic device to execute general steps in making the configuration definition, the instructions configuring the first programmable logic device to perform the particular steps more quickly than the general purpose microprocessor.

In one embodiment, the first programmable logic device is configured to perform the particular steps in making the configuration definition, including at least one of synthesis steps, mapping steps, placing steps, routing steps, and programmable logic device configuration file conversion steps.

In one embodiment, the first programmable logic device is one of a digital signal processing chip, a graphics processing unit chip, a gate array chip, and an application-specific integrated circuit; and the second programmable logic device is a field programmable gate array.

BRIEF DESCRIPTION OF THE DRAWINGS

FIG. 8 is a table of FPGA vs Software Performance Data, for an example configuration accelerating placement.

DETAILED DESCRIPTION

Figure 1:
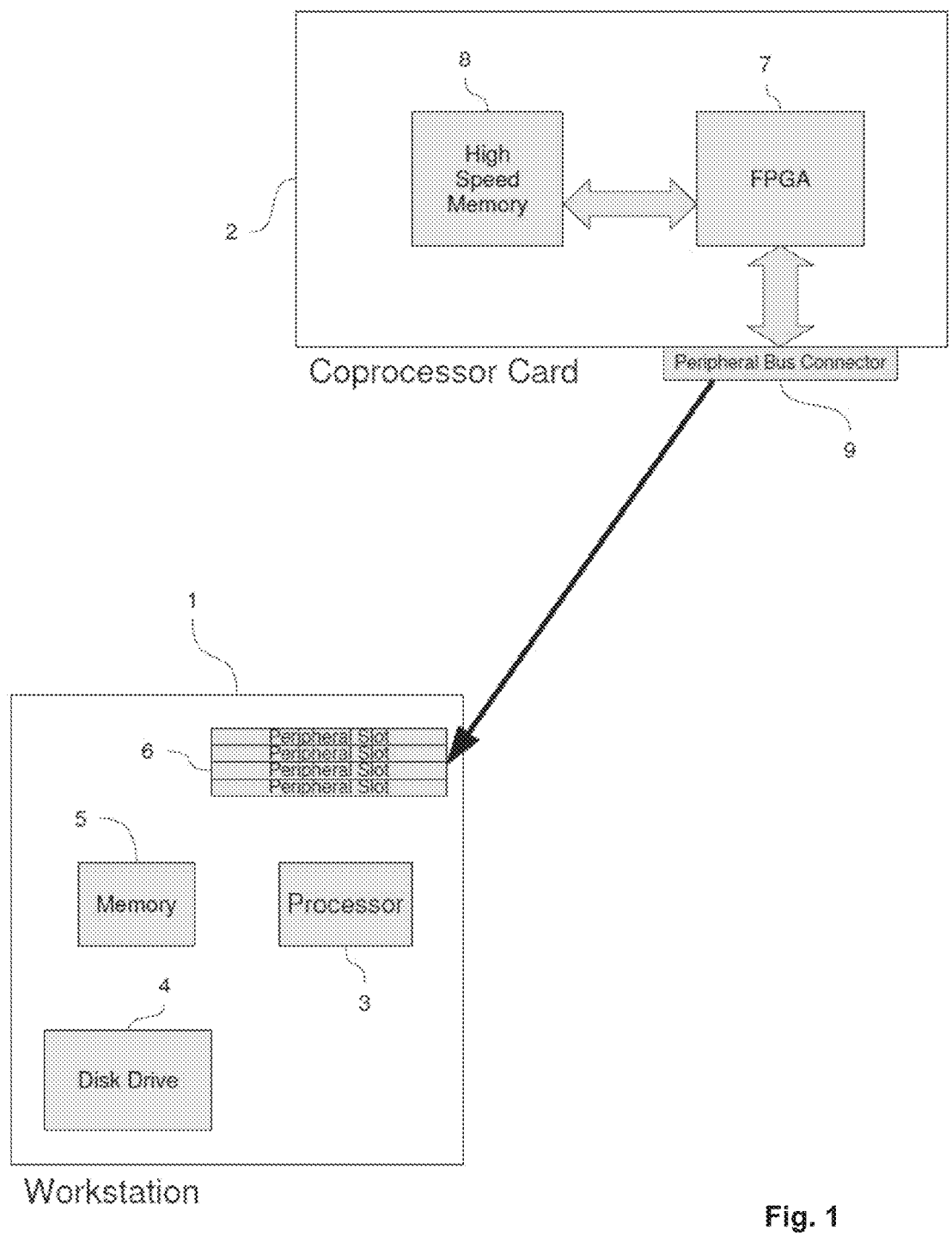
FIG. 1 shows that a workstation is used in systems to execute a programmable logic device design suite software package of EDA tools, with a coprocessor card in a peripheral slot.

FIG. 1 shows that a workstation is used in systems to execute a programmable logic device design suite software package of EDA tools. This technology adds a Coprocessor Card 2 to offload compute intensive repetitive operations from the workstation processor improving performance. The workstation 1 consists of a processor 3 or plurality of processors, a disk drive 4 for data and program storage, a plurality of memory modules 5, a plurality of peripheral slots 6, and other interfaces and components as necessary. The disk drive 4 is an example of a computer readable medium, which can be non-transitory; the computer readable medium can also be a hard disk, a floppy disk, a CD-ROM, an optical medium, or a removable media cartridge. The computer readable medium stores program instructions and/or data structures of the described technology. The Coprocessor Card 2 consists of a programmable logic device 7, such as one or more FPGAs configured with the processing elements required for the algorithm, and high speed memory 8, and a peripheral bus interface connector 9. This figure shows the coprocessor card 2 installed in a peripheral slot 6 in the workstation 1.

Figure 2:
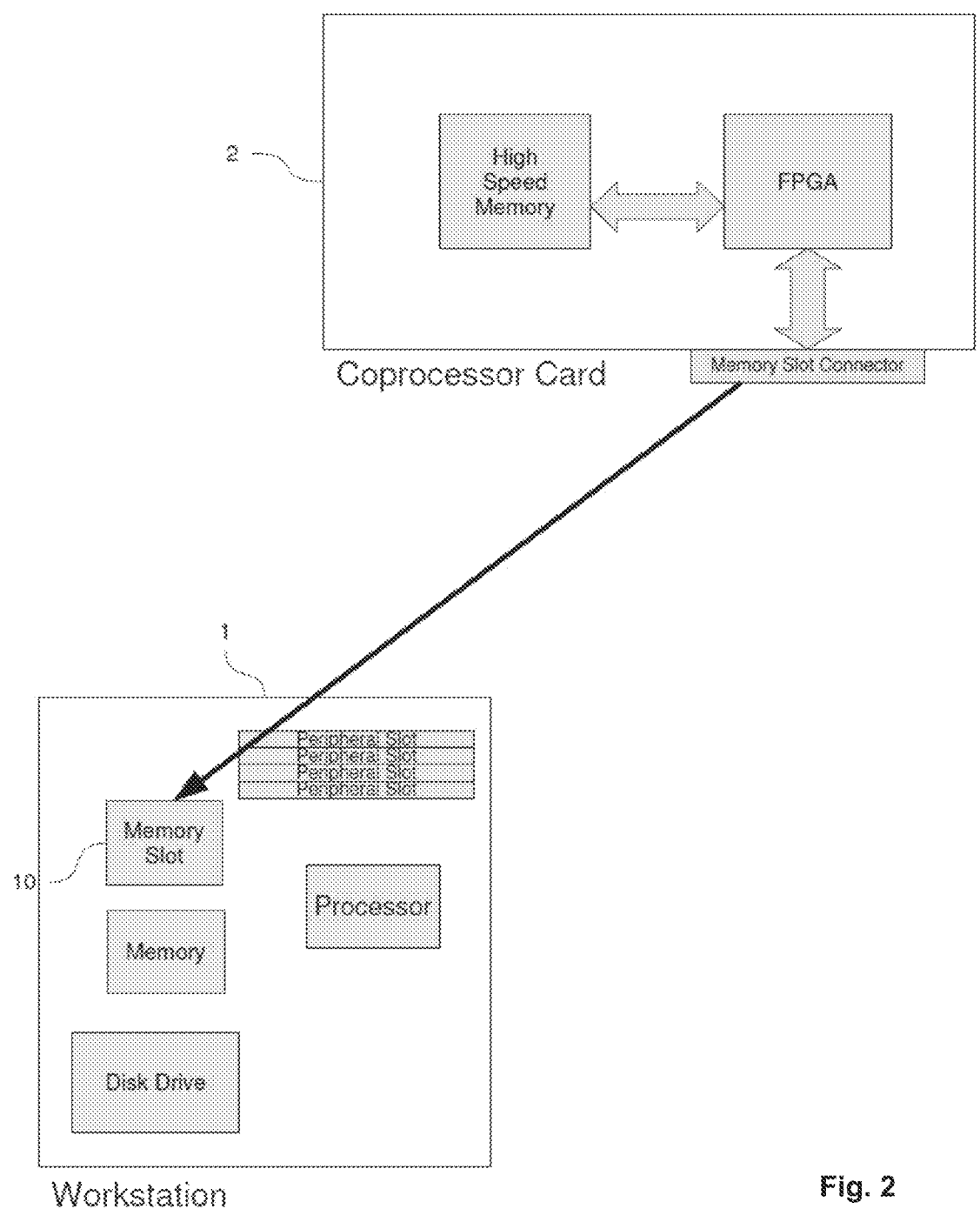
FIG. 2 figure shows the same configuration as FIG. 1, except the coprocessor card emulates a workstation memory module.

FIG. 2 figure shows the same configuration as FIG. 1, except the coprocessor card emulates a workstation memory module. It is installed to connect to a Memory Module Slot 10.

Figure 3:
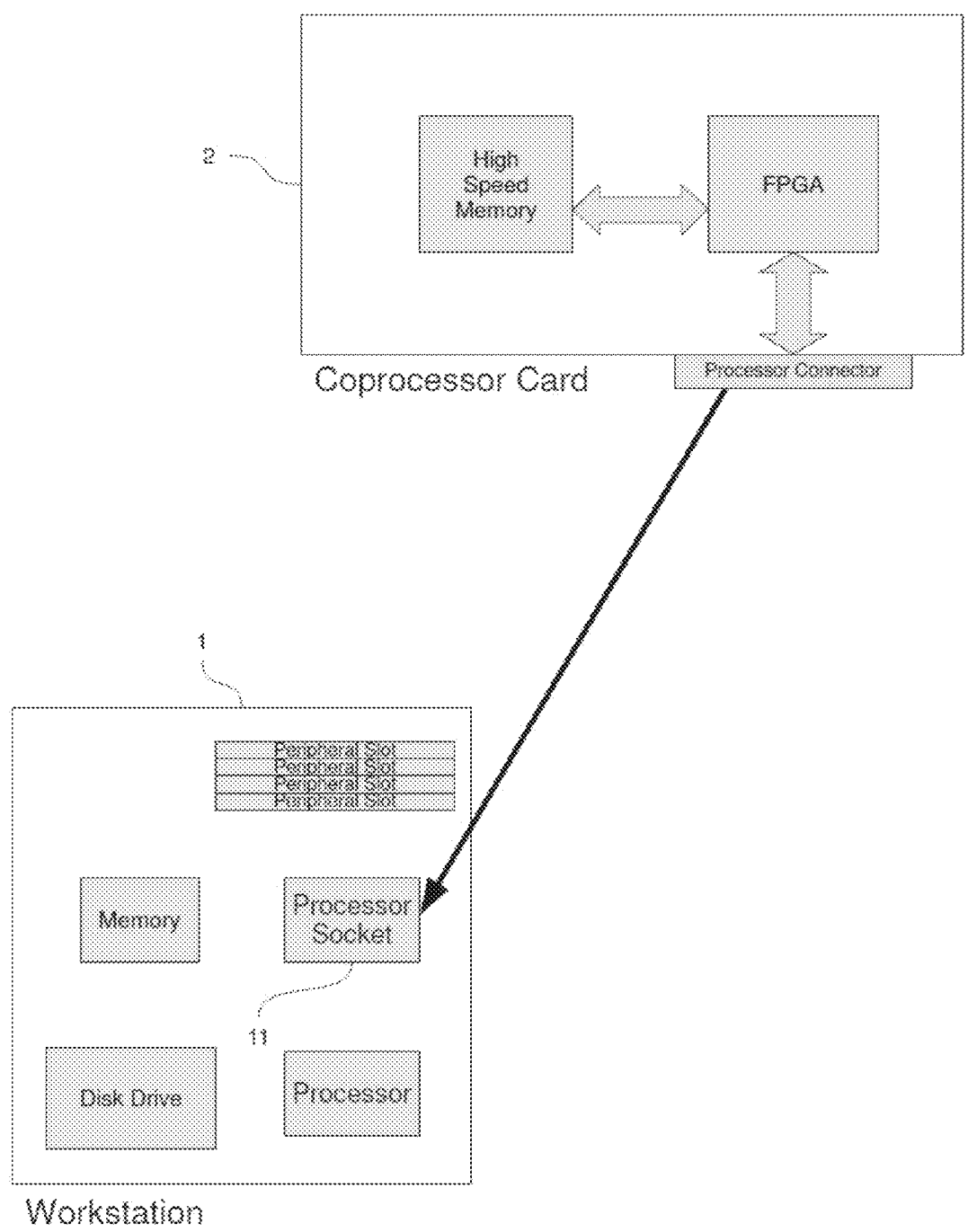
FIG. 3 shows the same configuration as FIG. 1, except the coprocessor card emulates a processor in a multi-processor workstation.

FIG. 3 shows the same configuration as FIG. 1, except the coprocessor card emulates a processor in a multi-processor workstation. It is installed to connect to a Processor Socket 11.

Figure 4:
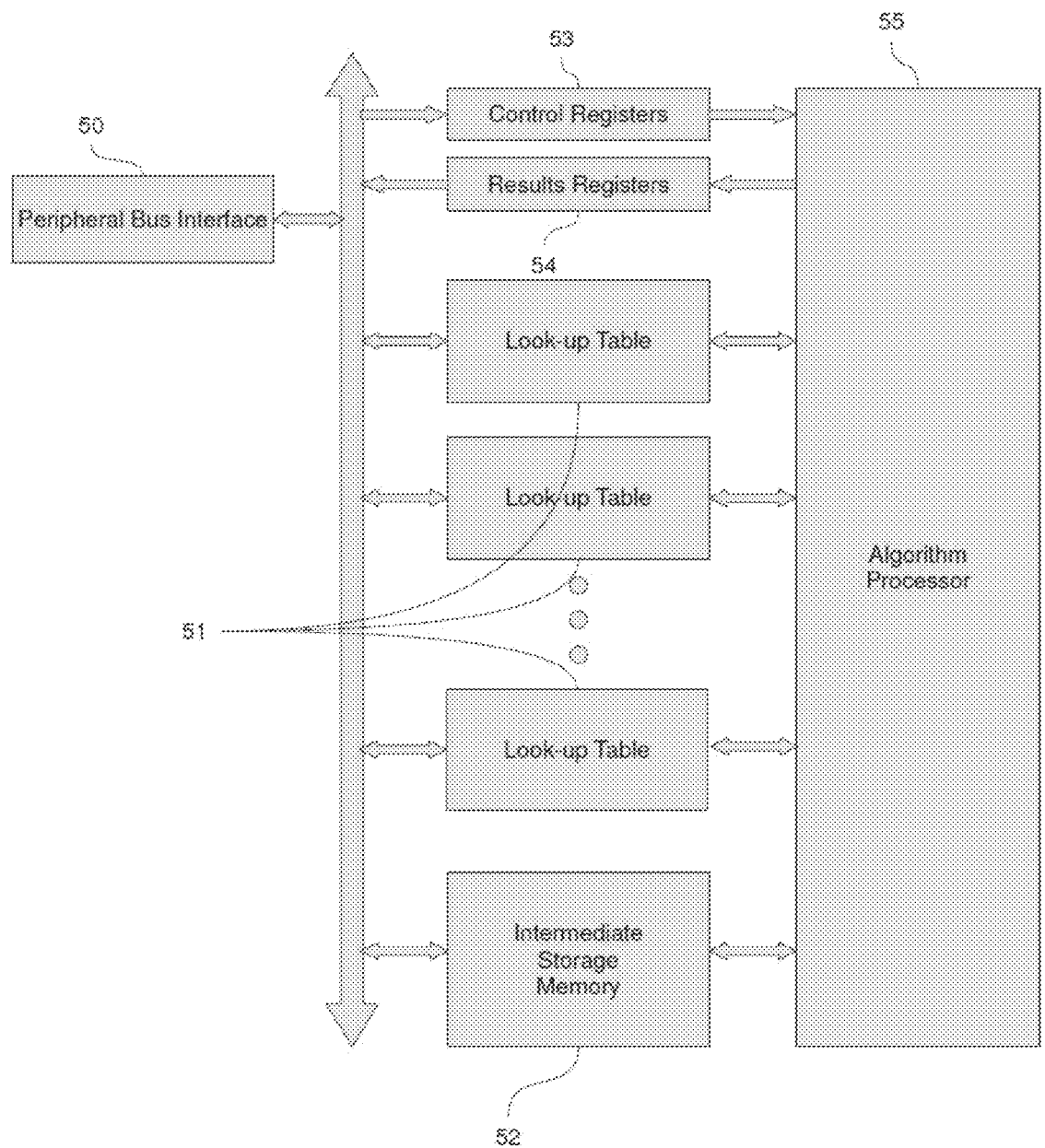
FIG. 4 shows a possible organization of the logic of the coprocessor card.

FIG. 4 shows a possible organization of the logic of the coprocessor card. It has a peripheral bus interface 50 for connection to the workstation. Over that interface the workstation software may load look-up tables 51, configure memory data structures in Intermediate Storage Memory 52, set control registers 53, and read status and results from registers 54. The algorithm processor 55 executes the algorithm based on the look-up table 51 information, memory 52 structures and registered control provided 53, updates memory data 52, and returns registered results and status 54.

Figure 5:
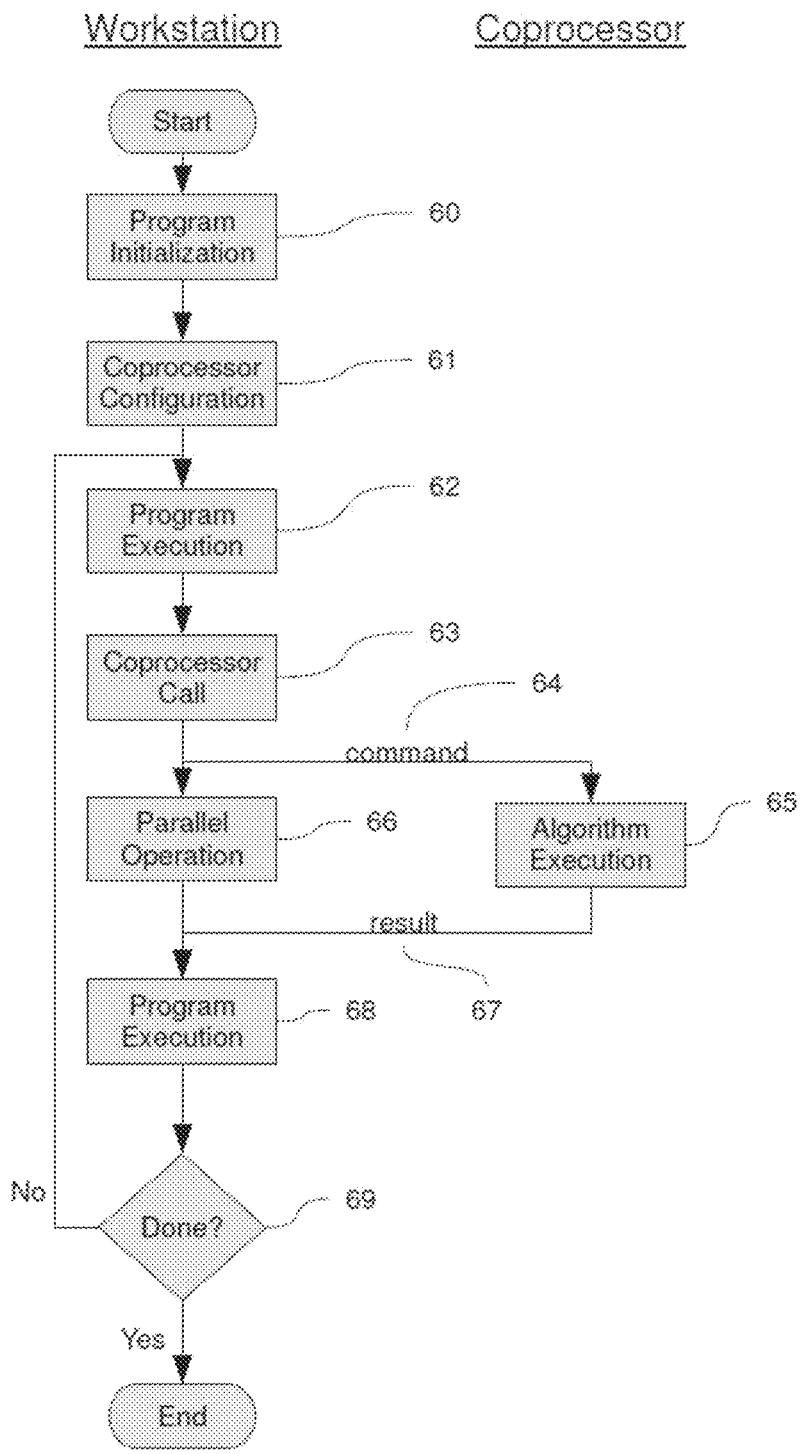
FIG. 5 shows a generic flow of the workstation and coprocessor operation.

FIG. 5 shows a generic flow of the workstation and coprocessor operation. When a particular program is invoked, the program first initializes internal variables and data structures 60. It then initializes the coprocessor with control information, lookup table contents, memory structures, and other required configuration 61. At this point, the software begins executing the steps required to perform the desired result, until it reaches a function which the coprocessor implements 62. The coprocessor execution is invoked 63 with appropriate parameters 64, and the coprocessor executes the requested function 65. Meanwhile, the workstation processor may perform other operations 66. When the coprocessor function is complete, the result 67 is returned to the workstation processor and its execution continues 68 utilizing the returned result. This is repeated 69 until the program is complete.

Figure 6:
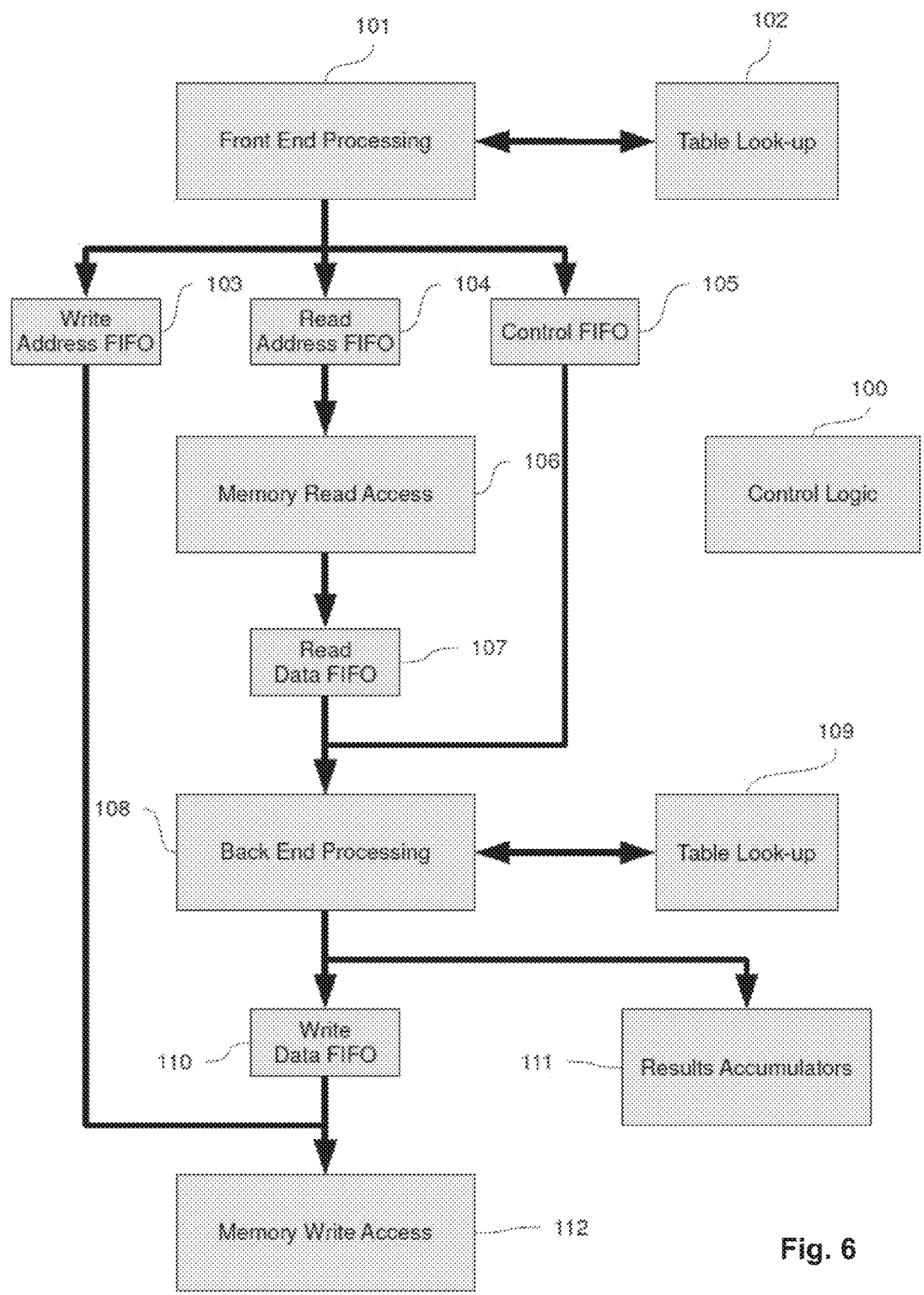
FIG. 6 shows the coprocessor FPGA configuration and processing for functions accelerated by the FPGA, for an example configuration accelerating placement.

FIG. 6 shows the coprocessor FPGA configuration and processing for the example block placement cost function and/or other functions accelerated by the FPGA 7. The Control Logic block 100 receives a command and parameters from the workstation, clears the Results Accumulators 111, and enables the processing. Based on the command and parameters, the Front End Processing block 101 executes a series of table look-ups 102 which determine the address of data to be read from the memory which is entered into the Read Address FIFO 104, the address of data to be written to the memory which is entered into the Write Address FIFO 103, and control information needed by the back end processing which is entered into the Control FIFO 105. When the memory controller detects the Read Address FIFO 104 has valid data, a Memory Read Access 106 is initiated. When the memory returns read data, it is entered into the Read Data FIFO 107. When the Back End Processing block 108 detects the Read Data FIFO 107 has valid data, it is used, in combination with data from the Control FIFO 105 to perform a series of computations including several Table Look-ups 109 to compute the cost values. For each of these values, the data is entered into the Write Data FIFO 110. The Back End Processing block 108 also presents the computed cost values to the Results Accumulators block 111 to totalize the values. When the memory controller detects the Write Data FIFO has valid data, it is used, in combination with the data from the Write Address FIFO 103 to write the data to the memory.

All of the elements in this figure are active simultaneously with data flowing in a pipelined fashion. The Control Logic block 100 detects when all data has flowed through all of the elements and reports a "done" signal to the workstation so it may read the results from the Results Accumulators 111.

This document mentions an FPGA in two primary contexts. In a first context, the FPGA is an example of a programmable logic device which divides roles with a general purpose microprocessor in running EDA tools. In a second context, the FPGA is an example of a programmable logic device into which the configuration definition resulting from the EDA tools is loaded, such that the programmable logic device implements a circuit design.

We will use the term "compilation" to describe the entire process of making a configuration definition of an FPGA, or converting a proposed FPGA design written in a high-level language, such as Verilog or VHDL, into a file that can be directly downloaded to a specific FPGA chip to implement a circuit design on the FPGA.

Typically, compilation follows several sequential steps:

1. Synthesis converts the high-level language to an intermediate-level language, commonly an industry standard known as RTL (register transfer level).

The first step in Programmable Logic definition is to describe the desired functionality in a high level language, such as Verilog or VHDL. This description is then converted into basic logic elements (BLEs) such as look up tables (LUTs), flip-flops, and other basic elements in the programmable logic chip by use of a process called Synthesis. This is logically similar to compiling a software program written in a high level language. A coprocessor can be used to speed up this process.

In most compilers, the largest portion of the compute time is taken up by converting the input source code into individual syntactical elements, a process called scanning. The coprocessor hardware that is the subject of this patent is configured with tables that are loaded with defined strings of characters that make up the language elements, with associated functional type identifiers and identifying enumerations. Another table is loaded with the characters that are separators of the elements. By referencing these tables at hardware speeds, compiler time savings is achieved.

In operation, the microprocessor streams the source code into the coprocessor. The logic in the coprocessor performs parallel comparisons of the characters in the stream with the language element tables to identify the individual elements. The output of the coprocessor is a new stream of identifiers indicating the syntactical elements encountered in the input stream. Elements not recognized are assumed to be numbers or symbols and are returned marked as such. This stream of identifiers is sent back to the microprocessor for semantic analysis, which generally is quite rapid, completing the synthesis processing.

The result of this initial compilation is a listing of the basic logic elements described above, the configuration of these elements, and a "wire list" of the signals connecting the elements. This is used as input to the next step of the definition process, mapping.

2. Mapping further refines the output of a prior phase into the lower level logic elements of the specific FPGA target chip.

Mapping, also known as packing or clustering, combines basic logic elements (BLEs) into larger blocks called clusters, which are in a form to be used in the placement function. The mapping step takes a netlist describing the connectivity of LUTs, flip-flops, and other basic logic block functions and combines groups of LUTs and flip-flops into clusters that will fit into a block of the targeted programmable logic chip. This function also applies to specialized function blocks such as memory, math functions, I/O blocks, and clock functions that may be present in the target programmable device. Then, the mapping program emits a netlist describing the connectivity of those blocks and their configuration. Mapping software attempts to optimize the groups of LUTs and flip-flops in order to minimize the number of clusters required, as well as minimizing the number of inputs required for each cluster, the number of connections required between clusters, while maximizing the speed of the resulting configuration after routing. This can be further optimized by specifically minimizing the external connections between blocks that are on the critical timing path.

Coprocessor acceleration for this process is undertaken by loading a table in the coprocessor memory containing the smallest grain blocks (e.g. LUTs and flip-flops), a basic logic element or BLE, their net IDs for all connections, and a slack value (the amount of time that can be added to a connection without increasing the delay of the entire circuit) for each net connection.

The coprocessor is then signaled by the microprocessor to start the mapping operation as follows: The hardware scans the BLE table and computes, at hardware speeds, a criticality value based on the number of connections and the amount of slack. Using this, the BLEs are ranked from most to least critical. The mapping operation then takes the most critical BLE and assigns it to a "working" cluster. Mapping continues by examining the unassigned BLEs in parallel on the coprocessor to find the one that is most "attractive" when combined with the current working cluster. Attractiveness is determined by comparing the candidate BLE signals for a best match to the signals already present and determining if the required resources are available in the new BLE. Timing is also taken into consideration. Once the cluster is full, the BLEs assigned are marked as used in the BLE table, and the cluster assignments are written to an output buffer. The microprocessor is signaled that a completed cluster is ready. Then the next critical BLE is used to start a new cluster. This process repeats until all BLEs are assigned.

Some implementations combine mapping with placement, which eliminates the need for a separate mapping step. Using a coprocessor to undertake this combined function can still greatly improve the time required for this task, for the same reasons as specified above and in the discussion on placement.

3. The placement, or placing, step of FPGA design implementation seeks to put each logic element in the best location within the FPGA chip. Element placement within the chip affects the performance of the resulting design due to interconnect delays, as well as the routablity of the signals within the available routing resources. There are an extremely large number of possible arrangements of the logic elements and exhaustively trying each of them is prohibitive in the amount of compute time it takes. A number of algorithms have been developed to reduce the number of arrangements that must be evaluated to settle on one that meets the requirements of the design.

All placement algorithms require an evaluation of a "score" of a trial placement. This allows the algorithm to decide if changes made in the placement are beneficial or not. The score function must be executed a large number of times so a coprocessor implementation of this score, or cost function can greatly reduce the time required for a placement algorithm. This coprocessor can be implemented with a number of tables and a computation engine. The tables are loaded by the microprocessor. A block table is loaded with logic element block descriptions consisting of input net IDs, output net IDs, and location information. A net table is loaded with net descriptions including output nodes and input nodes that are connected. An input table is loaded with criticality information for each block input. Criticality is based on the "slack", the difference between the design specified maximum allowable delay and the computed delay. Cost tables are loaded with delay values for Manhattan distances between blocks.

The coprocessor computation engine can access these tables in parallel and evaluate a total score of the placed design. The distance each net segment traverses is computed, and the delay of the segment is obtained from the cost tables. The score includes a total delay of every net segment, and a score weighted by net input criticality. This score is returned to the microprocessor on completion. Other scoring weighting functions are possible depending on the requirements of the algorithm.

The coprocessor is also able to evaluate limited portions of the design where the algorithm has made placement changes. The microprocessor directs the coprocessor to update the location of a small number of blocks and evaluate the change in score that the change makes, and return the value to the microprocessor. This is much faster than reevaluating the entire design.

4. Routing assigns the chip routing resources that will connect those logic elements.

After all the blocks have been placed, the interconnections must be routed through available routing resources. The router takes into consideration not only the shortest path, but also the timing cost. Here again, a coprocessor can improve performance significantly by executing at hardware speeds.

Routing using a coprocessor begins when a map of routing resources is created in coprocessor memory. Each routing resource entry contains a resource identifier, connectivity information, a timing delay value for the cost of traversing the resource, and a field with the identifier of the net segment or net node that is using this resource (once specified). This table also includes temporary registers used to contain the distance values used during the routing algorithm process. The microprocessor loads registers with the net nodes to be connected, the driving node is marked at the source. The coprocessor runs a traditional routing algorithm, starting at the source, only utilizing routing resources not previously marked as used. After the route is determined, new used routing resources are marked as such in the routing resource map. The route timing cost is calculated. Route cost and route success/fail is returned to the microprocessor.

The timing cost function utilizes a criticality factor that allows weighting of each node for its timing importance in the design. It also uses a lookup table driven summation of the timing of each of the routing resources, weighted by the criticality factor.

One coprocessor implementation is configured as a connected array of cellular automata, each array element representing a signal routing switching matrix or other routing resource. This configuration is initialized by the microprocessor with the source block and pin of a net, and all the sink blocks. The cellular automata array is started from the signal source and propagates the minimum routing timing cost from source to sinks, utilizing any unused routing resources and keeping track of the accumulated delay cost. When all sinks are reached, the minimum delay route is traced back to the source and the route is noted and reported back to the microprocessor. This is iterated until all signals are routed.

Using another entry point to the coprocessor, the microprocessor loads a net identifier and the coprocessor "unroutes" the net, freeing the routing resources used. This allows for iterative improvement of the total routing. The same cellular automata mechanism is used for route timing improvement by removing selected routes and rerouting critical routes under control of the microprocessor.

The microprocessor controls the process, decides the order in which routes are assigned, and drives the nets to rip-up and reroute. The coprocessor does the repetitive and time consuming tasks of the actual routing and timing evaluation, at hardware rather than software speeds.

5. Conversion to a downloadable format, or programmable logic device configuration file conversion, which creates a bit level file that can be directly downloaded to program the specific FPGA to perform the desired actions.

After a programmable logic design has been compiled, placed, and routed, the result is a list of block configuration values for the internal structure of the programmable logic. This data must be put into a format that can be loaded into the programmable logic chip. The loading is usually performed in a serial fashion, or in a serial data stream that has been broken into regularly sized data items. The data is also usually encrypted to reduce the possibility of reverse engineering the design from the data stream, and checksums and data correction codes may be added to ensure the integrity of the data. A coprocessor configuration can also be used to improve this operation.

The coprocessor is configured with definitions of the fields for the configuration of each logic block, each I/O block, each programmable interconnect, and other programmable structures within the programmable logic chip, and the serial stream loading order. The microprocessor loads a block of coprocessor memory over the local bus, in a format that is convenient for the microprocessor data structures. When this memory is loaded with the complete design the coprocessor extracts all of the relevant fields from the memory and concatenates them as specified into the serial stream as required for loading into the programmable logic chip. The serial data is then encrypted by the microprocessor using the algorithm and keys supplied by the microprocessor. In this process, the coprocessor computes any required checksums and data correction codes. The resulting data is buffered in the coprocessor memory and the microprocessor reads the result to be stored in the output data file. Again, efficiencies are achieved by performing operations at hardware speeds.

An alternative implementation includes a buffer in the coprocessor memory to receive parts of the design definition, but in an order such that the coprocessor may begin the data extraction and formation of the serial stream in parallel with the data loading. As each portion of the serial stream is assembled, it is passed to the coprocessor encryption algorithm. The result of the encryption is assembled into a number of output buffers and the microprocessor is signaled when each buffer is complete so it may retrieve the data. This implementation allows for further performance improvement because the microprocessor spends less time waiting for the coprocessor to complete the operation.

There are several different types of algorithms that are used in some or all of the steps:
1. Synthesis
2. Mapping
3. Placement
4. Routing
5. Configuration file conversion These algorithms often include:
1. A scanner, which separates the individual syntactic elements of an input file into a stream consisting of the smallest logically meaningful unit, called a lexeme. (Typically used in step 1 above)
2. A parser, which takes a stream of lexemes and applying a pre-specified syntax to determine that the input is syntactically correct and specify the specific actions to be performed. (Step 1)
3. An emitter, which takes a syntactically correct stream of lexemes and output the appropriate format required. (Steps 1, 5)

4. A candidate generator which, for a low level circuit description, emits a specific chip layout that could implement that description. (Steps 2, 3, 4)
5. A candidate layout improver which, for a specific chip layout, proposes an alternative layout which could also implement that description (Steps 2, 3, 4)
6. A cost function, which, for a specific data configuration, uses a specified function to develop a result, called a "score," that measures the desirability of that particular configuration. (Steps 2, 3, 4)
7. A comparison function, which looks at different specific configurations of data and their scores, and decides which configuration is preferred. (Steps 2, 3, 4)
8. A controller which determines when sufficient specific data configurations have been examined so that a particular data configuration is sufficiently optimal to allow moving on to the next step in the process. (Steps 2, 3, 4)
9. A selection generator which chooses and generates specific data configurations to test either through a deterministic or random generation method. (Steps 2, 3, 4)
10. An encryptor which modifies a specific data configuration into a format usable by specific hardware. (Step 5)
11. A hardware characteristics analyzer which incorporates features unique to a specific FPGA chip into a low-level or RTL design. (Steps 1, 2)
12. A format translator which converts a data file from a specified input format to the format required to download the specified FPGA, possibly including encryption. (Step 5)
13. An error correction function that computes checksums that allow detection and correction of data stream data errors. (Step 5)

This list gives examples of algorithmic steps which can be accelerated by a programmable logic device working in tandem over a local bus with a general purpose microprocessor to undertake a successful compilation. The programmable logic device which works in tandem with the general purpose microprocessor is configured such that one or more of the algorithmic steps in one or more of synthesis, mapping, placing, routing, and programmable logic device configuration file conversion, is performed more quickly on the programmable logic device than on the general purpose microprocessor. Compilation may include other algorithms beyond those listed above. Also, a specific stage of the compilation may or may not require all of these types of functions.

The programmable logic device is programmable to perform the specific functions of the algorithmic steps for the design "compilation" steps more quickly than the general purpose microprocessor. Examples of such programmability are stored programs, look-up tables, data structures, and processing and control elements required to perform the necessary functions. A major advantage of the coprocessor implementation is its ability to have multiple banks of memory allowing simultaneous parallel access to lookup tables and data storage without contention. Also, the coprocessor can have multiple computation and control elements all operating simultaneously to perform the specific task required more efficiently than a general purpose processor.

Examples of a programmable logic device that accelerates algorithmic steps, are a digital signal processing chip, a graphics processing unit chip, a gate array chip, and an application-specific integrated circuit. Another example is a programmable logic device with programmably configurable interconnections, such as a field programmable gate array (FPGA). Instances in this document of an FPGA as the programmable logic device may be interpreted as covering the other examples of a programmable logic device that accelerates algorithmic steps.

The local bus which couples the general purpose microprocessor and the programmable logic device is a high speed, low latency, interconnect that transfers control signals and data between the general purpose microprocessor and the programmable logic device within the same workstation. Examples of such a bus would be PCI (Peripheral Component Interconnect) and its related buses PCI-Express and PCI-X; AGP graphics processor bus; memory buses like SDRAM, SLDRAM and RDRAM; interprocessor connections such as the Front Side bus implemented by Intel microprocessors; and USB, especially the versions 2.0 and beyond.

Each of these steps contain highly iterative computations which potentially can be executed in specialized highly pipelined parallel hardware instead of a general purpose processor, to decrease the processing time. This hardware can be implemented in an FPGA connected to a workstation peripheral bus so the workstation can execute the control and non-repetitive parts of the algorithms, and hand off the compute intensive parts to the FPGA co-processor. The FPGA may be reloaded with a different hardware configuration for each of the compilation steps if all the required logic does not fit in one design. Even higher performance could be achieved if the accelerator co-processor could be connected to the workstation processor's front-side bus, or possibly emulating processor memory, as peripheral bus transactions have significant latency.

Of the functions listed above, one embodiment is focused on speeding the execution of the cost function. Other embodiments could have significant benefits in speeding the execution of the other components of the process, with special focus on the scanners, selection generators, encryptors, and comparison functions.

One embodiment is focused on place and route. It starts with logic already mapped to blocks, a net list, and a timing specification, plus an architecture description file. The program reads the input files and randomly assigns the logic blocks to chip locations. It then evaluates a total "cost" score. For each connection (path from an output to an input on a net) two real values are computed, the delay based on the Manhattan distance between the nodes, and a timing score which is the delay multiplied by a real "criticality" factor. These two numbers are totalized for all the connections in the design to give the total "cost" of that placement. The criticality factors are assigned to each connection based on the timing specification.

The next step is a repetitive process where two blocks are chosen randomly and their coordinates are swapped. Then the change in cost is evaluated to determine if this is a beneficial move or not. The calculation involves re-computing the delay and timing cost factors for each connection affected by the move and subtracting it from its previous value, then totalizing the differences. This delta cost score is evaluated and the move is either kept if it is advantageous, or reverted if it is not.

This process is controlled by a higher level algorithm that uses a "temperature" factor that is iteratively reduced. At the beginning, the "temperature" starts at a high level. This drives the routine that determines which blocks to swap, to swap widely separated blocks and as the "temperature" is reduced, the blocks to swap are chosen from a smaller area. Also, when the "temperature" is high, swaps are accepted even if the delta cost is somewhat negative and as the "temperature" is reduced, more stringent criteria is used to decide if the swap should be kept or reverted. As the "temperature" is reduced, periodically the entire cost table is re-computed, and the criticality values recalculated based on the difference between the delay and the timing specifications. When the "temperature" reaches a threshold value, the process is stopped. This process is known as "simulated annealing".

In one embodiment, the place function is implemented in the accelerator; if the placement is good, the routing is quite quick.

One routine, comp_delta_td_cost, which computes the change in delay and timing cost of swapping two blocks, upon execution analysis was taking about 22% of the execution time. The underlying function comp_td_point_to_point_delay takes as arguments a net number and a pin index in the net, and returns a floating point number with the delay cost of that net segment. The low level routine comp_td_point_to_point_delay is also called by comp_td_costs which computes the costs for all connections.

The comp_td_point_to_point_delay routine looks up the X and Y locations of each end of the connection, takes the absolute value of the difference, and looks up the delay cost in a lookup table. There are actually four tables, one for each type of connection, input to logic block, logic block to logic block, logic block to output, and input to output.

The FPGA logic implements lookup tables for nets, blocks, and the cost tables. The net table has an entry for each net which contains the number of pins in the net and a pointer an array of block IDs in general memory. The block table has an entry for each block consisting of the X, Y, and type of block. The cost tables are two dimension arrays which contain floating point numbers, and are indexed by the absolute value of the X and Y distance between end points. These tables are allocated by the software initialization from the FPGA internal static RAM, and from the QDR memory on the FPGA board. The RAM is much faster than the QDR and so the tables are allocated to it first, and depending on the size of the design, QDR is used if the tables don't fit in the RAM. The initialization loads all the lookup tables as well as some registers that provide pointers to the tables and control information.

In operation, the software comp_td_point_to_point_delay routine writes a net number id and a net index within that net to registers in the FPGA. The hardware then performs the following steps:

1. Look up the net table location for the specified net and capture pointer to block ID array.
2. Look up block ID of driving block, which is at the pointer location, and save in the source block register.
3. Look up block ID of sink block, which is at the pointer location plus the net index and save in the sink block register.
4. Look up X and Y locations and types of source and sink blocks from block table.
5. Take absolute value of differences of X and Y. Use these to create an index into the dealy cost table, using a delay cost table dimension register loaded from software initialization.
6. Select a delay cost table using the source and sink types, and look up the delay cost using the cost index.
7. Load the delay cost floating point value in the output register, and set the done flag to notify the software that the result is ready.

The software loads the new X and Y locations in the block lookup table to swap the locations of blocks, and uses this function to evaluate the changes. Some embodiments implement more of the delay evaluation function in the FPGA, reducing the number of bus accesses required. There are three functions implemented:

1. Compute Cost Table function corresponding to the software comp_td_costs function. The FPGA walks the entire net list and computes the cost values for each net segment. Cost values are in two floating point numbers, called delay cost and timing cost; delay cost is as described above, and the timing cost is the delay times a floating point "criticality" factor, which is assigned by software for each net node based on timing specifications and previous results. The cost values are stored in the Net Data Table and totalized in floating point accumulators. The total costs for the entire net list are returned.

2. Compute Net Cost function, corresponding to the software comp_td_point_to_point_delay function plus parts of the comp_delta_td_cost function. This computes the cost change for a specified net segment, or the cost change of an entire net. This new cost is stored in a temporary location in the Net Data Table and the change from the previous value accumulated, and the total may be read when the software is finished indicating all segments affected by a block swap. After reading, the accumulator is reset by the software.

3. Update Net Cost function, corresponding to a part of the software update_td_cost function. This copies the temporary cost values stored in the Net Data Table for the specified net segment, or an entire net, to the cost value locations in the Net Data Table.

The FPGA logic implements lookup tables for nets, blocks, and the cost tables as in the previous version, plus the Net Data Table. The net table has for each net, a new pointer to the beginning of a block in the Net Data Table, where there is a record for each pin in the net. The record contains the block number of the signal source, the criticality factor, delay cost, timing cost, temporary delay cost, and temporary timing cost.

The Net Table, Block Table, cost tables, and Net Data Table are allocated by the software initialization from the FPGA internal static RAM, and from the QDR memory on the FPGA board. The RAM is much faster than the QDR and so the tables are allocated to it first, and depending on the size of the design, QDR is used if the tables don't fit in the RAM. The initialization loads all the lookup tables as well as some registers that provide pointers to the tables and control information.

The Compute Cost Table function performs the following steps for each net in the net table:

1. The net is looked up in the Net Table and the number of pins and the pointer to the Net Data Table are captured.
2. The first location pointed to in the Net Data Table is read and the block number captured. This is the source block.
3. The source block is looked up in the Block Table and the X, Y and Type values captured in the source registers.
4. For each additional pin in the net, the subsequent locations in the Net Data Table are read and the sink block number captured as well as the criticality factor. Then the following steps are performed:
    a. The sink block is looked up in the Block Table and the X, Y, and Type values captured in the sink registers.
    b. Absolute value of the difference of Source and Sink X and Y values are computed and combined to create a cost table index.
    c. The cost table is selected using the source and sink block types, and the delay value is captured.
    d. The delay is multiplied by the criticality to compute the timing cost.
    e. Delay cost and Timing cost are written back to the Net Data Table.
    f. Delay cost and Timing cost are added to the two cost accumulators.

5. When the entire net list has been computed, a done flag is set and the software can read the total cost accumulated.

The Compute Net function is invoked by the software with two parameters, the net number, and the ipin number. If ipin is set to −1, all pins on the net are computed, otherwise only the net segment from the source to the indicated pin is computed. The Compute Net function performs the following steps:

1. The net is looked up in the Net Table and the number of pins and the pointer to the Net Data Table are captured.
2. The first location pointed to in the Net Data Table is read and the block number captured. This is the source block.
3. The source block is looked up in the Block Table and the X, Y and Type values captured in the source registers.
4. If ipin is −1, the following are done for all pins on the net, otherwise only the one specified pin is computed:
    a. The Net Data Table is read for the pin, and sink block number, criticality, and stored delay and timing cost values are captured.
    b. The sink block is looked up in the Block Table and the X, Y, and Type values captured in the sink registers.
    c. Absolute value of the difference of Source and Sink X and Y values are computed and combined to create a cost table index.
    d. The cost table is selected using the source and sink block types, and the delay value is captured.
    e. The delay is multiplied by the criticality to compute the timing cost.
    f. Delay cost and Timing cost are written back to the Net Data Table temporary cost locations.
    g. Delay cost and Timing cost are each subtracted from their respective values retrieved from the Net Data Table in step 4.a, and the delta values are added to the two cost accumulators. This tracks the change in cost.

The Update Net function is invoked by the software with two parameters, the net number, and the ipin number. If ipin is set to −1, all pins on the net are updated, otherwise only the net segment from the source to the indicated pin is updated. The Update Net function performs the following steps:

1. The net is looked up in the Net Table and the number of pins and the pointer to the Net Data Table are captured.
2. If ipin is −1, the following are done for all pins on the net, otherwise only the one specified pin is computed:
    a. The Net Data Table is read for the pin, and temporary delay and timing cost values are captured.
    b. Temporary Delay and Timing costs are written back to the Net Data Table stored cost locations.

Some embodiments implement the full subroutines comp_td_costs, comp_delta_td_cost, and update_td_cost. Some embodiments introduce a high level of pipelining to the processing. This adds complexity and makes a significant improvement in calculation time. A functional description of the three functions follows:

1. Compute Cost Table function corresponding to the software comp_td_costs function. The FPGA walks the entire net list and computes the cost values for each net segment. Cost values are in two floating point numbers, called delay and timing; delay is as described earlier, and the timing cost is the delay times a floating point criticality factor, which is assigned by software for each net node based on timing specifications and previous results. The cost values are stored in the Input Data Table. The total costs for the entire net list is returned.
2. Compute Blocks function, corresponding to the software comp_delta_td_cost function. The software writes two block numbers to registers in the FPGA, representing two blocks that have been swapped. The second block number may be −1 if the swap is to a previously empty block. The function sequences through all nets connected to the inputs and outputs of the specified blocks, and computes the cost change for all segments. The changed cost for each segment is stored in a temporary location in the Net Data Table and the difference accumulated, and the total is read by the software when complete.
3. Update Blocks function, corresponding to the software update_td_cost function. The software writes two block numbers to registers in the FPGA, representing two blocks that have been swapped. The second block number may be −1 if the swap is to a previously empty block. The function sequences through all nets connected to the inputs and outputs of the specified blocks and copies the temporary cost values stored in the Net Data Table for each net segment to the cost value locations in the Net Data Table.
4. A prediction function where the Compute Blocks function stores its result directly in the Net Data Table, instead of the temporary location if the computation is predicted to be retained, eliminating the Update Blocks function if the prediction is correct. The cost is that the Compute Blocks function must be called again with the blocks swapped back if the prediction is incorrect which does take a bit of extra time, but if the prediction is correct the majority of the time, this is a net improvement.

The FPGA logic implements lookup tables for nets, blocks, the Net Data Table (now renamed the Input Data Table, and the cost tables as in the previous version, plus the output Data Table. There is also a second copy of the Block Table so two parts of the logic can access it in parallel without interference. Structures of the tables are as follows:

```
//structures for lookup tables
//note that these match the fpga idea of the structure - all bits are in the
//right place no matter what the compiler does.
/* fpga_block_table[block] */
typedef struct {
    unsigned int x           : 16;   //x location of this block
    unsigned int y           : 16;   //x location of this block
    unsigned int type        : 3;    //type of this block
    unsigned int unused      : 12;
    unsigned int outpointer  : 17;   //pointer to beginning of output
entries in output table
    unsigned int unused1     : 16;
    unsigned int num_opin    : 16;   //number of outputs connected from
this block
    unsigned int inpointer   : 17;   //pointer to beginning of input entries
in input table
    unsigned int num_ipin    : 15;   //number of inputs connected to this
                                       block
}s_fpga_block_table;
/* fpga_input_table[inpointer + ipin] */
typedef struct {
    float delay;            //delay cost of this input
    float timing;           //timing cost of this input
    float crit;             //criticality of this input
    int32 src_block;        //block number of driver of the net on this
                              input
    int32 unused;
    float delayt;           //temporary delay cost of this input
    float timingt;          //temporary timing cost of this input
    float unused1;
    int32 net;              //store net id for data recovery
    int32 net_pin;          //store pin on net for data recovery
}s_fpga_input_table;
/* fpga_output_table[outpointer + opin] */
typedef struct {
    unsigned int num_ipin   :15;    //number of inputs driven by this
                                      output
    unsigned int netpointer :17;    //pointer to the net table entry for this
                                      output
}s_fpga_output_table;
/* fpga_net_table[netpointer + ipin] */
typedef struct {
    unsigned int sink_block :15;    //block number of this input on
                                      the net
    unsigned int inpointer  :17;    //pointer to the input table entry
for this input on the net
}s_fpga_net_table;
```

There are four independent pre-defined blocks of memory, each independently addressed by the FPGA logic. This is so that they can be accessed in parallel with the need for contention arbitration.

FPGA static RAM is used for the first three blocks. The first contains the Block Table, Output Data Table, and Net Data Table. The second block contains a copy of the Block Table, and the third contains the cost tables. The Input Data Table is in the QDR memory. The amount of static RAM in the FPGA is limited; the Input Data Table is quite large and only can reside in the QDR.

The Net Data Table, Block Table, and Output Data Table are allocated by the software initialization within the first block of static RAM, the rest being pre-defined. The initialization software loads all the lookup tables as well as some registers that provide pointers to the tables and control information.

Some embodiments vary the FPGA sizes and the memory types such as QDR, DDR2 and DDR3 memory. Rearrangement of some of the logic, and changing the memory type can result in significant performance improvement.

The FPGA logic is divided into the Front End, and the Back End. These two sections are divided by the QDR memory containing the Input Data Table. For each function, the Front End pipeline sequences through the Block Table, Net Data Table and Output Data Table to indicate the net segments to operate on; each net segment has an entry in the Input Data Table. For each net segment affected, a QDR memory read cycle is initiated, and simultaneously, two FIFOs are written with data corresponding to that cycle to be passed to the Back End. The FIFO data consists of an address in the QDR to be written with the results, an operation code, and a block number, block X, Y, and Type which correspond to either the source block or sink block depending on the operation. The reason for this division is that QDR access cycles have significant latency, and the QDR memory runs in a different clock domain from the algorithm pipelines so the front end and back end pipelines are not in lock step. The back end pipeline runs whenever data arrives from the QDR memory; this can be as often as every clock. The back end computation must keep up with this rate or data will be lost; the QDR read cycle cannot be paused after being requested. The front end pipeline can be paused for various events including filling of the data FIFOs, and QDR input data queue full. The QDR memory can do simultaneous read and write cycles, so read-write arbitration is not required.

The FPGA operation for the three functions is now described. The compute cost table front end performs the following steps when the operation is started by the software:
1. Cost accumulators are set to zero and backend processing is enabled. Block counter is set to zero.
2. For each block in the block table:
    a. Read block table and capture block X, Y, Type, number of input pins, pointer to the Input Data Table entry.

b. For each input pin on the block:
  i. Start QDR cycle to read the Input Data Table entry.
  ii. Push QDR Input Data Table entry address onto the Write Address FIFO
  iii. Push Compute Table operation code, block number, block X, Y, and Type (sink block information) onto the Data FIFO.
3. When all input pins of all blocks have their QDR cycles started, wait for the back end to finish the computations as indicated by the Write Address FIFO going empty, then kick off the Accumulator Totalize operation. Each of the two Accumulators is actually implemented as four independent floating point adders and registers. This is because the floating point add takes 4 clocks and data may arrive every clock; The accumulator adders operate overlapped in parallel started one after the other as data arrives. The Accumulate Totalize operation adds the four partial sums together to create the final total costs.
4. Wait for the Accumulator Totalize to finish, then disable backend processing and indicate done so the software can read the cost accumulators.

The compute cost table back end performs the following steps:
1. When a QDR memory read presents data, read the data FIFO to determine the operation (compute table in this case), capture the criticality factor and net source block from the QDR Input Data Table data and the sink block X, Y, and Type from the data FIFO.
2. Look up the source block in the block table (note this is the secondary block table in SRAMb) and capture the source block X, Y, and Type.
3. Compute the absolute difference of the source and sink X and Y, and form the cost table index.
4. Select the proper cost table using the source and sink block Types, and look up the delay cost value from the table.
5. Do a floating point multiply of the delay cost value and the criticality to compute the timing cost value.
6. Read the Write Address FIFO and initiate a QDR write cycle to that address with the delay cost and timing cost values.
7. Start the delay and timing cost accumulators to add the new data to the running totals.

The Compute Blocks front end performs the following steps when the operation is started by the software loading the from block and to block registers:
1. Cost accumulators are set to zero and backend processing is enabled. The from block is copied to the block register.
2. Read block table and capture block X, Y, Type, number of input pins, pointer to the Input Data Table entry, number of output pins, and pointer to the Output Data Table entry.
3. For each input pin on the block:
  a. Start QDR cycle to read the Input Data Table entry.
  b. Push QDR Input Data Table entry address plus 2 (temporary cost data location) onto the Write Address FIFO.
  c. Push Compute Block Input operation code, block number, block X, Y, and Type (sink block information) onto the Data FIFO.
4. For each output pin on the block:
  a. Look up the output data using the Output Data Table pointer, plus the output number. Capture the number of pins driven by the output, and the pointer to the Net Table.
  b. For each input on the net:
    i. Look up the pin information using the Net Table pointer plus the pin number. Capture the sink block number and the pointer to the Input Data Table location.
    ii. Start QDR cycle to read the Input Data Table entry.
    iii. Push QDR Input Data Table entry address plus 2 (temporary cost data location) onto the Write Address FIFO.
    iv. Push Compute Block Input operation code, block number, block X, Y, and Type (source block information) onto the Data FIFO.
5. If there is a non-negative value in the to block register, load it into the block register and repeat steps 2 through 4.
6. When all input pins of all blocks have their QDR cycles started, wait for the back end to finish the computations as indicated by the Write Address FIFO going empty, then kick off the Accumulator Totalize operation.
7. Wait for the Accumulator Totalize to finish, then disable backend processing and indicate done so the software can read the cost accumulators.

An alternate form of the Compute Blocks front end is implemented for use when the prediction indicates it is likely the move will be accepted. It is identical except in steps 3.b and 4.b.iii the address pushed onto the Write Address FIFO is the Input Data Table entry address without offset so the result is written to the Delay and Timing entries rather than the temporary locations.

The Compute Blocks back end performs the following steps:
1. When a QDR memory read presents data, read the data FIFO to determine the operation (compute blocks input_phase or output_phase in this case). The processing is as follows:
  a. If the operation is input_phase:
    i. Capture the criticality factor, stored delay and timing cost values, and net source block number from the QDR Input Data Table data and the sink block X, Y, and Type from the data FIFO.
    ii. Look up the source block in the block table (note this is the secondary block table in SRAMb) and capture the source block X, Y, and Type.
  b. If the operation is output_phase:
    i. Capture the criticality factor, stored delay and timing cost values from the QDR Input Data Table data and the sink block number, and source X, Y, and Type from the data FIFO.
    ii. Look up the sink block in the block table (note this is the secondary block table in SRAMb) and capture the sink block X, Y, and Type.
2. Compute the absolute difference of the source and sink X and Y, and form the cost table index.
3. Select the proper cost table using the source and sink block Types, and look up the delay cost value from the table.
4. Do a floating point multiply of the delay cost value and the criticality to compute the timing cost value.
5. Read the Write Address FIFO and initiate a QDR write cycle to that address with the temporary delay cost and temporary timing cost values.
6. Subtract the new delay and timing cost values from the stored delay and timing cost values to calculate the delta cost amount.
7. Start the delay and timing cost accumulators to add the delta cost data to the running totals.

8. Wait for the Accumulator Totalize to finish, then disable backend processing and indicate done so the software can read the cost accumulators.

The Update Blocks front end performs the following steps:
1. Backend processing is enabled. The from block is copied to the block register.
2. Read block table and capture number of input pins, pointer to the Input Data Table entry, number of output pins, and pointer to the Output Data Table entry.
3. For each input pin on the block:
   a. Start QDR cycle to read the Input Data Table entry plus 2 (temporary cost data location).
   b. Push QDR Input Data Table entry address onto the Write Address FIFO.
   c. Push Update Block operation code onto the Data FIFO.
4. For each output pin on the block:
   a. Look up the output data using the Output Data Table pointer, plus the output number. Capture the number of pins driven by the output, and the pointer to the Net Table.
   b. For each input on the net:
      i. Look up the pin information using the Net Table pointer plus the pin number. Capture the sink block number and the pointer to the Input Data Table location.
      ii. Start QDR cycle to read the Input Data Table entry plus 2 (temporary cost data location) or Input Data Table entry if the alternate form is being executed.
      iii. Push QDR Input Data Table entry address onto the Write Address FIFO.
      iv. Push Update Block operation code onto the Data FIFO.
5. If there is a non-negative value in the to block register, load it into the block register and repeat steps 2 through 4.
6. When all input pins of all blocks have their QDR cycles started, wait for the back end to finish the computations as indicated by the Write Address FIFO going empty, then disable backend processing and indicate done to the software.

The Update Blocks back end processing performs the following steps:
1. Capture the Temporary Delay Cost and Temporary Timing Cost values from the QDR read data.
2. Read the Write Address FIFO and initiate a QDR write cycle to that address with the temporary delay cost and temporary timing cost values. This replaces the previous stored cost values with the computed new ones.

Figure 7:
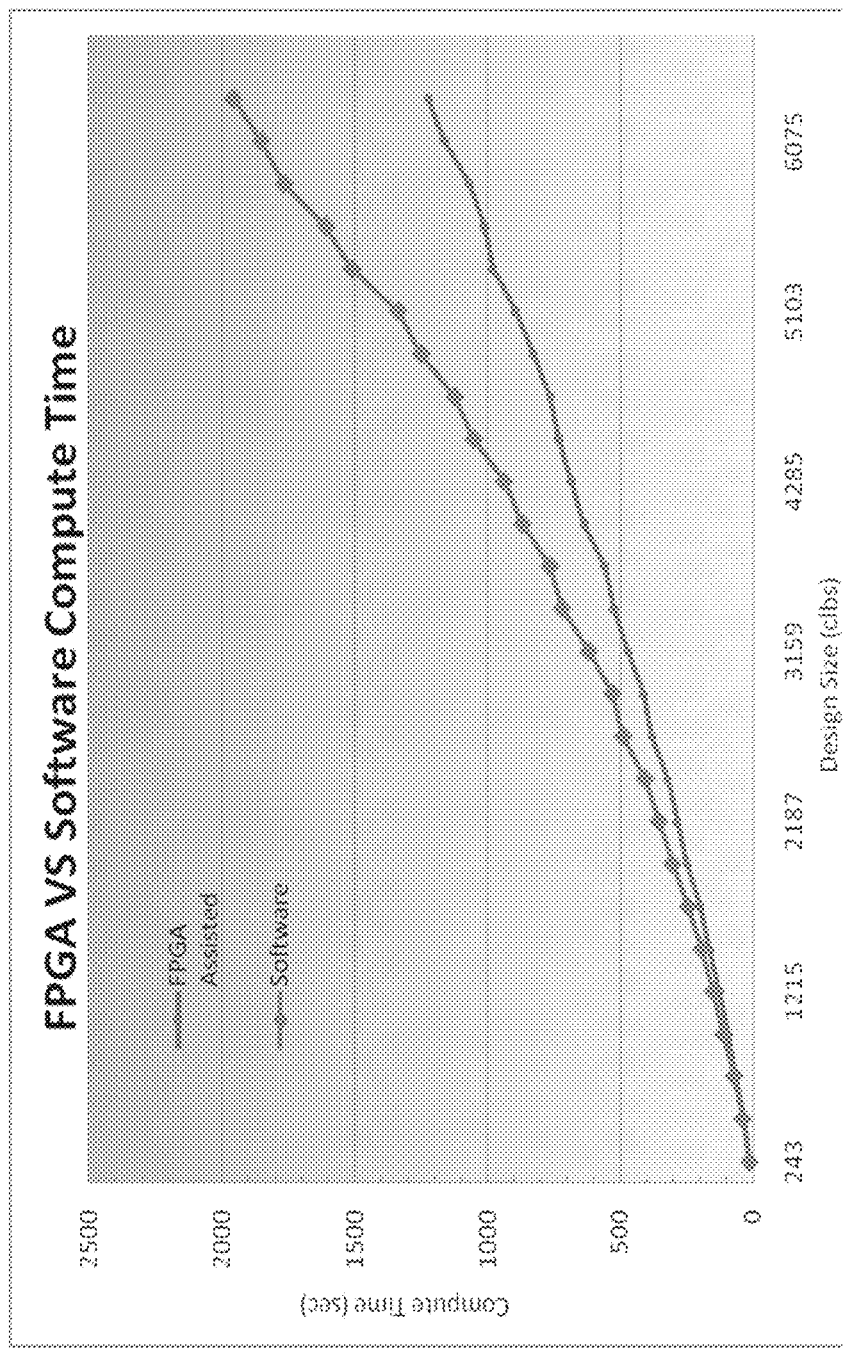
FIG. 7 is a graph of FPGA Assisted vs Software Compute Time, for an example configuration accelerating placement.

Performance of the system is significantly faster than the software executing on a general purpose microprocessor without FPGA assistance, with a small design placement time improved by about 7% and a medium sized design improved by 38%. Larger designs should show even better performance differences. Present FPGA chips will accommodate designs an order of magnitude greater than the largest test design. As indicated by the performance graph of FIG. 7, the compute time reduction for these very large designs is dramatic.

This development shows that with a fairly simple FPGA board, a hardware implementation of a placement algorithm can significantly improve on the time required for the placement phase of the FPGA design compilation process. As the size of the design increases, the benefit increases.

The bulk memory on the test board is 18 bits wide QDRII+ running at 350 Mhz. A 36-bit wide version of this memory is in development which will improve the performance a bit more. The size of this memory limits the size of the design this board can evaluate; a board with larger memory will have to be designed for the final implementation.

The FPGA on the test board is a Xilinx Vertex 6, where Xilinx is shipping Vertex 7 chips with increased internal clock rates possible and more internal memory; the chip on the test board is not even the top of the Vertex 6 line. Altera also has FPGA chips with comparable performance.

Other embodiments are directed to other compilation steps can be undertaken.

Appendix of Test Data and Conditions

The FPGA assisted placement performance was tested against the software only placement using a set of test designs created for this purpose. The designs are basically a single core design with about 250 logic blocks, replicated a number of times with a common global clock. The time is measured from the initial placement to the final placement. The placement result was verified to be identical in the hardware and software implementation execution. The table in FIG. 8 gives the design parameters, and the timing results collected.

The tests were run on an HP workstation with a Quad-core Intel Xeon E5504 processor running at 2.00 GHz. The placement process uses only a single core. The FPGA board is plugged into a PCI-Express slot running four lanes at 2.5 GHz. The PCI-Express is connected directly to the Xilinx Vertex 6 XC6VSX315T-2FF1759 FPGA chip. The PCI-Express interface is implemented in the FPGA using the PCI-Express physical core from Xilinx, and the XpressLite FPGA core from PLDA. The FPGA board has 18 Megabytes of QDRII+ memory running at 350 MHz on an 18-bit wide bus, of which 16 bits are used. The QDRII+ interface is implemented in the FPGA using the MIG memory controller core from Xilinx. All other memory and logic are implemented within the FPGA. The FPGA design consists of approximately 3800 lines of Verilog code, plus additional modules for memory controllers, FIFOs, floating point arithmetic—add, subtract, and multiply, and the PCI controller. The design occupies about 14% of the logic resources in the chip, plus about 75% of the internal static memory. The algorithm part of the design runs at a clock rate of 150 MHz.

We claim:

1. An apparatus that divides roles between a general purpose microprocessor and a first programmable logic device, in making a configuration definition which is loaded into a second programmable logic device to implement a circuit design on the second programmable logic device, the apparatus including:

the general purpose microprocessor configured to perform general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and the first programmable logic device with programmably configurable interconnections, the first programmable logic device coupled to the general purpose microprocessor by a local bus, the first programmable logic device with programmably configurable interconnections configured to perform the particular steps in making the configuration definition more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

2. The apparatus of claim 1, wherein the first programmable logic device is configured to perform the particular steps in making the configuration definition, including at least one of synthesis steps, mapping steps, placing steps, routing steps, and programmable logic device configuration file conversion steps.

3. The apparatus of claim 1, wherein the first programmable logic device and the second programmable logic device are field programmable gate arrays.

4. The apparatus of claim 1, wherein at least one of the first programmable logic device and the second programmable logic device is a field programmable gate array.

5. A method of a general purpose microprocessor and a first programmable logic device performing roles in making a configuration definition which is loaded into a second programmable logic device to implement a circuit design on the second programmable logic device, the method including:
the general purpose microprocessor performing general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and
the first programmable logic device with programmably configurable interconnections performing the particular steps in making the configuration definition more quickly than the general purpose microprocessor, the first programmable logic device with programmably configurable interconnections configured to perform the particular steps in making the configuration definition more quickly than the general purpose microprocessor, the first programmable logic device coupled to the general purpose microprocessor by a local bus,
wherein the first programmable logic device performs computations to assist the general microprocessor in making the configuration definition which is loaded into the second programmable logic device, and the first programmable logic device and the second programmable logic device have different configuration definitions.

6. The method of claim 5, wherein the first programmable logic device is configured to perform the particular steps in making the configuration definition, including at least one of synthesis steps, mapping steps, placing steps, routing steps, and programmable logic device configuration file conversion steps.

7. The method of claim 5, wherein the first programmable logic device and the second programmable logic device are field programmable gate arrays.

8. The method of claim 5, wherein at least one of the first programmable logic device and the second programmable logic device is a field programmable gate array.

9. An apparatus with a first programmable logic device having a role in making a configuration definition which is loaded into a second programmable logic device to implement a circuit design on the second programmable logic device, the apparatus including:
the first programmable logic device with programmably configurable interconnections, the first programmable logic device configured to perform particular steps in making the configuration definition which is loaded into the second programmable logic device with programmably configurable interconnections to implement the circuit design on the second programmable logic device with programmably configurable interconnections, the first programmable logic device reliant on a general purpose microprocessor coupled by a local bus to the first programmable logic device to execute general steps in making the configuration definition, the first programmable logic device configured to perform the particular steps more quickly than the general purpose microprocessor,
wherein the first programmable logic device performs computations to assist the general microprocessor in making the configuration definition which is loaded into the second programmable logic device, and the first programmable logic device and the second programmable logic device have different configuration definitions.

10. The apparatus of claim 9, wherein the first programmable logic device is configured to perform the particular steps in making the configuration definition, including at least one of synthesis steps, mapping steps, placing steps, routing steps, and programmable logic device configuration file conversion steps.

11. The apparatus of claim 9, wherein the first programmable logic device and the second programmable logic device are field programmable gate arrays.

12. The apparatus of claim 9, wherein at least one of the first programmable logic device and the second programmable logic device is a field programmable gate array.

13. A method of a first programmable logic device performing a role in making a configuration definition which is loaded into a second programmable logic device to implement a circuit design on the second programmable logic device, the method including:
the first programmable logic device with programmably configurable interconnections performing particular steps in making the configuration definition which is loaded into the second programmable logic device with programmably configurable interconnections to implement the circuit design on the second programmable logic device with programmably configurable interconnections, the first programmable logic device being reliant on a general purpose microprocessor coupled by a local bus to the first programmable logic device to execute general steps in making the configuration definition, the first programmable logic device configured to perform the particular steps more quickly than the general purpose microprocessor,
wherein the first programmable logic device performs computations to assist the general microprocessor in making the configuration definition which is loaded into the second programmable logic device, and the first programmable logic device and the second programmable logic device have different configuration definitions.

14. The method of claim 13, wherein the first programmable logic device is configured to perform the particular steps in making the configuration definition, including at least one of synthesis steps, mapping steps, placing steps, routing steps, and programmable logic device configuration file conversion steps.

15. The method of claim 13, wherein the first programmable logic device and the second programmable logic device are field programmable gate arrays.

16. The method of claim 13, wherein at least one of the first programmable logic device and the second programmable logic device is a field programmable gate array.

17. A non-transitory computer readable medium encoded with instructions programming a first programmable logic device having a role in making a configuration definition which is loaded into a second programmable logic device to implement a circuit design on the second programmable logic device, the instructions including:

computer readable instructions configuring the first programmable logic device with programmably configurable interconnections to perform particular steps in making the configuration definition which is loaded into the second programmable logic device with programmably configurable interconnections to implement the circuit design on the second programmable logic device with programmably configurable interconnections, the instructions configuring the first programmable logic device to be reliant on a general purpose microprocessor coupled by a local bus to the first programmable logic device to execute general steps in making the configuration definition, the instructions configuring the first programmable logic device to perform the particular steps more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

18. The medium of claim 17, wherein the first programmable logic device is configured to perform the particular steps in making the configuration definition, including at least one of synthesis steps, mapping steps, placing steps, routing steps, and programmable logic device configuration file conversion steps.

19. The medium of claim 17, wherein the first programmable logic device and the second programmable logic device are field programmable gate arrays.

20. The medium of claim 17, wherein at least one of the first programmable logic device and the second programmable logic device is a field programmable gate array.

21. An apparatus that divides roles between a general purpose microprocessor and a first programmable logic device, in making a configuration definition which is loaded into a second programmable logic device to implement a circuit design on the second programmable logic device, the apparatus including:

the general purpose microprocessor configured to perform general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and the first programmable logic device coupled to the general purpose microprocessor by a local bus, the first programmable logic device configured to perform the particular steps in making the configuration definition more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

22. The apparatus of claim 21, wherein the first programmable logic device is configured to perform the particular steps in making the configuration definition, including at least one of synthesis steps, mapping steps, placing steps, routing steps, and programmable logic device configuration file conversion steps.

23. The apparatus of claim 21, wherein the first programmable logic device is one of a digital signal processing chip, a graphics processing unit chip, a gate array chip, and an application-specific integrated circuit; and the second programmable logic device is a field programmable gate array.

24. A method of a general purpose microprocessor and a first programmable logic device performing roles in making a configuration definition which is loaded into a second programmable logic device to implement a circuit design on the second programmable logic device, the method including:

the general purpose microprocessor performing general steps in making the configuration definition which is loaded into the second programmable logic device with programmably configurable interconnections to implement the circuit design on the second programmable logic device with programmably configurable interconnections, wherein the general purpose microprocessor relies on the first programmable logic device to perform particular steps in making the configuration definition; and the first programmable logic device performing the particular steps in making the configuration definition more quickly than the general purpose microprocessor, the first programmable logic device configured to perform the particular steps in making the configuration definition more quickly than the general purpose microprocessor, the first programmable logic device coupled to the general purpose microprocessor by a local bus, wherein the first programmable logic device performs computations to assist the general microprocessor in making the configuration definition which is loaded into the second programmable logic device, and the first programmable logic device and the second programmable logic device have different configuration definitions.

25. The method of claim 24, wherein the first programmable logic device is configured to perform the particular steps in making the configuration definition, including at least one of synthesis steps, mapping steps, placing steps, routing steps, and programmable logic device configuration file conversion steps.

26. The method of claim 24, wherein the first programmable logic device is one of a digital signal processing chip, a graphics processing unit chip, a gate array chip, and an application-specific integrated circuit; and the second programmable logic device is a field programmable gate array.

27. An apparatus with a first programmable logic device having a role in making a configuration definition which is loaded into a second programmable logic device to implement a circuit design on the second programmable logic device, the apparatus including:

the first programmable logic device configured to perform particular steps in making the configuration definition which is loaded into the second programmable logic device with programmably configurable interconnections to implement the circuit design on the second programmable logic device with programmably configurable interconnections, the first programmable logic device reliant on a general purpose microprocessor coupled by a local bus to the first programmable logic device to execute general steps in making the configuration definition, the first programmable logic device configured to perform the particular steps more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

28. The apparatus of claim 27, wherein the first programmable logic device is configured to perform the particular steps in making the configuration definition, including at least one of synthesis steps, mapping steps, placing steps, routing steps, and programmable logic device configuration file conversion steps.

29. The apparatus of claim 27, wherein the first programmable logic device is one of a digital signal processing chip, a graphics processing unit chip, a gate array chip, and an application-specific integrated circuit; and the second programmable logic device is a field programmable gate array.

30. A method of a first programmable logic device performing a role in making a configuration definition which is loaded into a second programmable logic device to implement a circuit design on the second programmable logic device, the method including:

the first programmable logic device performing particular steps in making the configuration definition which is loaded into the second programmable logic device with programmably configurable interconnections to implement the circuit design on the second programmable logic device with programmably configurable interconnections, the first programmable logic device being reliant on a general purpose microprocessor coupled by a local bus to the first programmable logic device to execute general steps in making the configuration definition, the first programmable logic device configured to perform the particular steps more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

31. The method of claim 30, wherein the first programmable logic device is configured to perform the particular steps in making the configuration definition, including at least one of synthesis steps, mapping steps, placing steps, routing steps, and programmable logic device configuration file conversion steps.

32. The method of claim 30, wherein the first programmable logic device is one of a digital signal processing chip, a graphics processing unit chip, a gate array chip, and an application-specific integrated circuit; and the second programmable logic device is a field programmable gate array.

33. A non-transitory computer readable medium encoded with instructions programming a first programmable logic device having a role in making a configuration definition which is loaded into a second programmable logic device to implement a circuit design on the second programmable logic device, the instructions including:

computer readable instructions configuring the first programmable logic device to perform particular steps in making the configuration definition which is loaded into the second programmable logic device with programmably configurable interconnections to implement the circuit design on the second programmable logic device with programmably configurable interconnections, the instructions configuring the first programmable logic device to be reliant on a general purpose microprocessor coupled by a local bus to the first programmable logic device to execute general steps in making the configuration definition, the instructions configuring the first programmable logic device to perform the particular steps more quickly than the general purpose microprocessor, wherein the first programmable logic device performs computations to assist the general microprocessor in making the configuration definition which is loaded into the second programmable logic device, and the first programmable logic device and the second programmable logic device have different configuration definitions.

34. The medium of claim 33, wherein the first programmable logic device is configured to perform the particular steps in making the configuration definition, including at least one of synthesis steps, mapping steps, placing steps, routing steps, and programmable logic device configuration file conversion steps.

35. The medium of claim 33, wherein the first programmable logic device is one of a digital signal processing chip, a graphics processing unit chip, a gate array chip, and an application-specific integrated circuit; and the second programmable logic device is a field programmable gate array.

* * * * *